(12) United States Patent
Mizutani et al.

(10) Patent No.: US 11,926,246 B2
(45) Date of Patent: Mar. 12, 2024

(54) TRAVELING BODY SYSTEM

(71) Applicants: MURATA MACHINERY, LTD., Kyoto (JP); NATIONAL UNIVERSITY CORPORATION TOYOHASHI UNIVERSITY OF TECHNOLOGY, Toyohashi (JP)

(72) Inventors: Minoru Mizutani, Inuyama (JP); Kazuhiro Ishikawa, Inuyama (JP); Masafumi Hayakawa, Inuyama (JP); Takashi Ohira, Toyohashi (JP); Naoki Sakai, Toyohashi (JP); Hiroki Kuniyoshi, Toyohashi (JP); Makoto Teramoto, Toyohashi (JP)

(73) Assignees: MURATA MACHINERY, LTD., Kyoto (JP); NATIONAL UNIVERSITY CORPORATION TOYOHASHI UNIVERSITY OF TECHNOLOGY, Aichi (JP)

( * ) Notice: Subject to any disclaimer, the term of this patent is extended or adjusted under 35 U.S.C. 154(b) by 1103 days.

(21) Appl. No.: 16/628,047

(22) PCT Filed: Jun. 1, 2018

(86) PCT No.: PCT/JP2018/021197
§ 371 (c)(1),
(2) Date: Jan. 2, 2020

(87) PCT Pub. No.: WO2019/008966
PCT Pub. Date: Jan. 10, 2019

(65) Prior Publication Data
US 2021/0138911 A1 May 13, 2021

(30) Foreign Application Priority Data
Jul. 6, 2017 (JP) .................................. 2017-132625

(51) Int. Cl.
*B60L 9/12* (2006.01)
*B60L 5/38* (2006.01)
(Continued)

(52) U.S. Cl.
CPC .................... *B60L 9/12* (2013.01); *B60L 5/38* (2013.01); *B60M 7/00* (2013.01); *H01L 21/67724* (2013.01); *H01L 21/67733* (2013.01)

(58) Field of Classification Search
CPC ......... H01L 21/67733; H01L 21/67724; B61B 3/02; B60L 2200/26; B60L 5/005; B60L 5/38; B60M 7/00
See application file for complete search history.

(56) References Cited

U.S. PATENT DOCUMENTS

2012/0114453 A1* 5/2012 Ota .................... H01L 21/67736
414/281
2013/0313071 A1* 11/2013 Kasuya ............... H01L 21/6773
198/375

FOREIGN PATENT DOCUMENTS

JP 2012-171765 A 9/2012
JP 5777139 B2 9/2015
(Continued)

OTHER PUBLICATIONS

English translation of Official Communication issued in International Patent Application No. PCT/JP2018/021197, dated Aug. 21, 2018.
(Continued)

*Primary Examiner* — Zachary L Kuhfuss
(74) *Attorney, Agent, or Firm* — Keating & Bennett, LLP

(57) ABSTRACT

In a local cart traveling system, a frame track includes first and second metal rails each with an L-shaped cross section and facing each other. A local cart is within the frame track, and includes a first electricity receiving tire and a second
(Continued)

electricity receiving tire to travel on horizontal travel surfaces of the rails. A voltage supplier supplies an AC voltage to the travel surfaces, so that the first metal rail and a first electricity receiving tire define a first capacitor and the second metal rail and the second electricity receiving tire define a second capacitor. The local cart includes a power receiver to receive AC power, and a travel motor that receives power after the AC power is rectified. The frame track includes a connecting plate as an electrical insulator covering portions of the surfaces of vertical walls of the first metal rail and the second metal rail.

5 Claims, 11 Drawing Sheets

(51) Int. Cl.
  *B60M 7/00* (2006.01)
  *H01L 21/677* (2006.01)

(56) References Cited

FOREIGN PATENT DOCUMENTS

| | | |
|---|---|---|
| JP | 2016-063684 A | 4/2016 |
| JP | 5988409 B1 | 9/2016 |

OTHER PUBLICATIONS

Official Communication issued in International Patent Application No. PCT/JP2018/021197, dated Aug. 21, 2018.

* cited by examiner

TRAVELING BODY SYSTEM

BACKGROUND OF THE INVENTION

1. Field of the Invention

The present invention relates to a traveling body system. In particular, the present invention relates to a traveling body system in which AC power is taken out from a capacitor between a metal rail and a wheel so as to drive a travel motor.

2. Description of the Related Art

As a method for supplying power to a vehicle, so-called tire power supply is known. The tire power supply is a wireless power transfer technique using capacitive coupling between a rail and a metal body inside the tire.

The following technique is known as the tire power supply. Two conductors are placed on the floor surface and are supplied with AC power. The two conductors and steel belts inside the two tires of the vehicle define capacitors. AC power is taken out from two electrodes that are adjacent to the tires and are capacitively coupled to the steel belts. The taken-out AC power is rectified and stored in a battery (see, for example, Japanese Patent No. 5777139).

In a conventional traveling body system using the tire power supply system, two metal rails constituting a track are used as power supply rails. Further, high frequency AC power is supplied to the rails. Therefore, if a worker carelessly touches the rail, the worker may receive an electric shock.

SUMMARY OF THE INVENTION

Preferred embodiments of the present invention provide safety improvements for workers in traveling body systems of tire power supply systems.

A plurality of preferred embodiments of the present invention are described below. Various aspects, elements, features, etc. of the various preferred embodiments of the present invention can be arbitrarily combined as necessary.

A traveling body system according to a preferred embodiment of the present invention includes a frame track, a traveling body, and a voltage supplier.

The frame track includes a first metal rail and a second metal rail. The first metal rail and the second metal rail have an L-shaped cross section and are laid out in parallel or substantially in parallel to face each other.

The traveling body is disposed within the frame track and includes a first wheel and a second wheel, so as to travel on horizontal travel surfaces of the first metal rail and the second metal rail.

The voltage supplier supplies an AC voltage to at least the travel surfaces of the first metal rail and the second metal rail, and the first metal rail and the first wheel define a first capacitor and the second metal rail and the second wheel define a second capacitor.

The traveling body includes a power receiver to receive AC power from the first capacitor and the second capacitor, and a travel drive motor to directly or indirectly receive power after the AC power received by the power receiver is rectified.

The frame track includes an electrical insulator covering at least a portion of vertical wall surfaces of the first metal rail and the second metal rail.

In this traveling body system, the electrical insulator covers the first metal rail and the second metal rail, and hence a worker hardly touches the first metal rail and the second metal rail even if the worker may touch the electrical insulator. Therefore, there is little risk that the worker would receive an electric shock.

A traveling body system according to another preferred embodiment of the present invention includes a frame track, a traveling body, and a voltage supplier.

The frame track includes one or more metal rails, an electrical insulator disposed on a travel surface of the metal rail, and two conductors provided to the electrical insulator. The two conductors are supplied with an AC voltage.

The traveling body is disposed within the frame track and includes a first wheel and a second wheel, so as to travel on the two conductors.

The voltage supplier supplies an AC voltage to each of the two conductors, and one of the conductors and the first wheel define a first capacitor and the other conductor and the second wheel define a second capacitor.

The traveling body includes a power receiver to receive AC power from the first capacitor and the second capacitor, and a travel drive motor to directly or indirectly receive power after the AC power received by the power receiver is rectified.

In this traveling body system, the metal rail of the frame track is electrically insulated from the conductor by the electrical insulator. Therefore, the frame track is not charged. Therefore, even if a worker accidentally touches the frame track, there is little risk that the worker would receive an electric shock.

The frame track may further include a second electrical insulator disposed on the two conductors.

The first wheel and the second wheel may travel on the second electrical insulator.

In this traveling body system, there is less risk of receiving an electric shock.

The second electrical insulator may be a resin substrate, and the conductor may be a metal thin film on the resin substrate.

In this traveling body system, the second electrical insulator and the conductor can be integrally formed, and hence manufacturing, carrying, and attaching thereof become easy. In other words, mass productivity is improved.

The two conductors may be laid out in parallel or substantially in parallel with a small gap in a width direction, and high frequency AC power may be differentially transmitted to the two conductors.

In this traveling body system, high frequency power is supplied by differential transmission, and hence there is little risk of adversely affecting electric equipment existing around the system.

The traveling body may include total four wheels including the first wheel and the second wheel.

In this traveling body system, the traveling body travels with stability.

Traveling body systems of tire power supply systems according to preferred embodiments of the present invention improve safety for workers.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

1. First Preferred Embodiment

Figure 1:
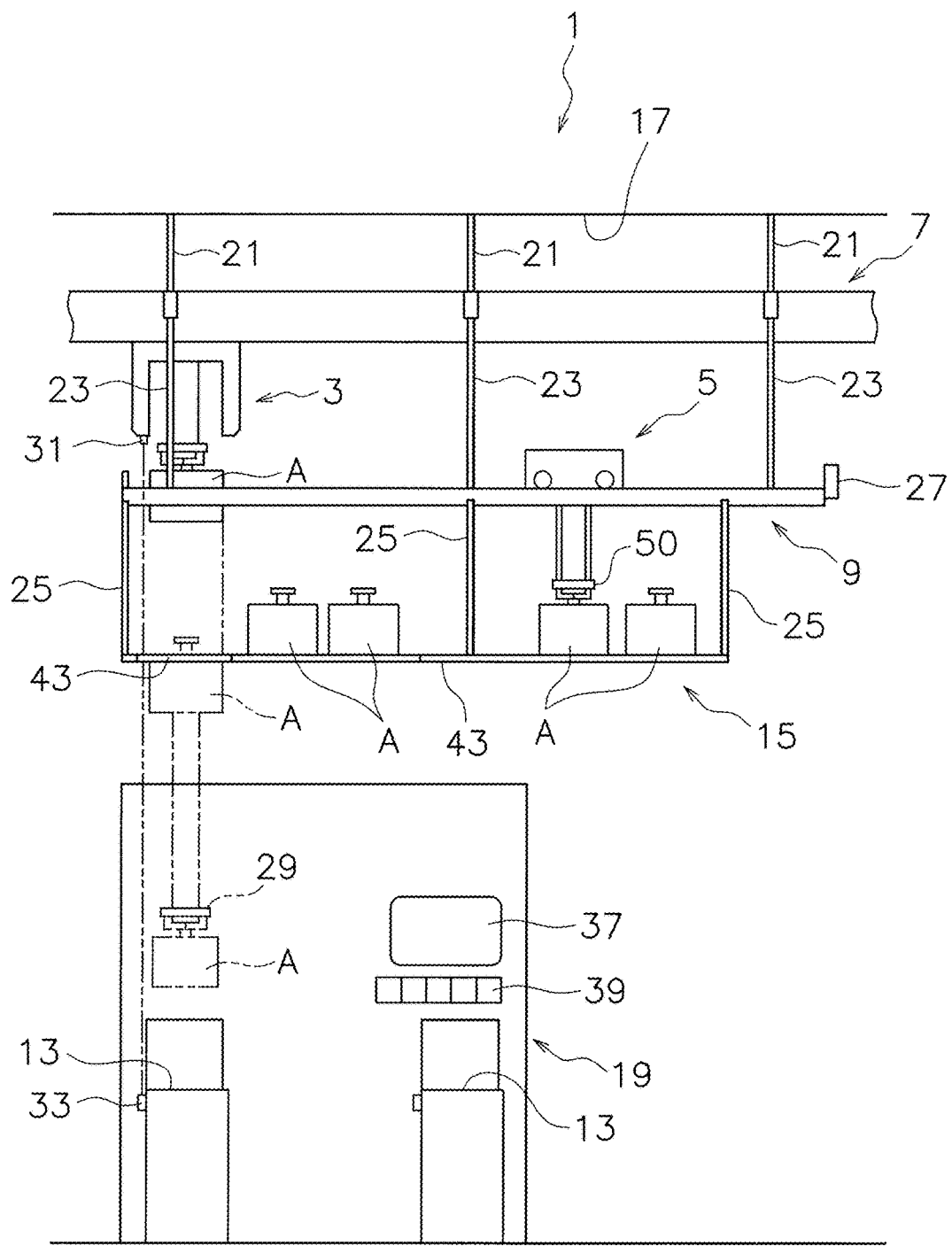
FIG. 1 is a side view of a main portion of a transport system of a first preferred embodiment of the present invention.
Figure 2:
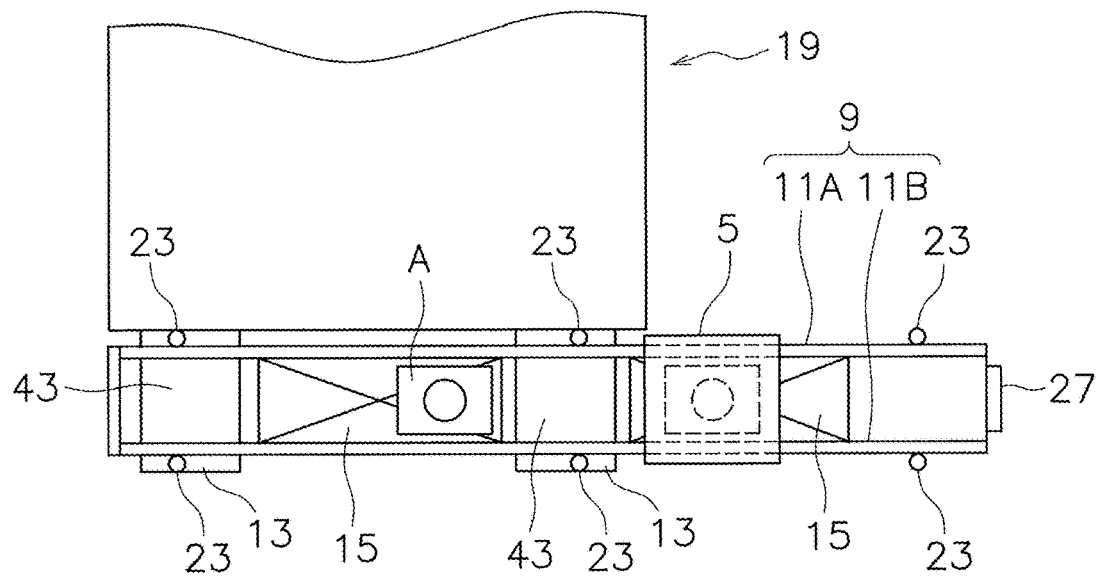
FIG. 2 is a plan view of a main portion of the transport system.
Figure 3:
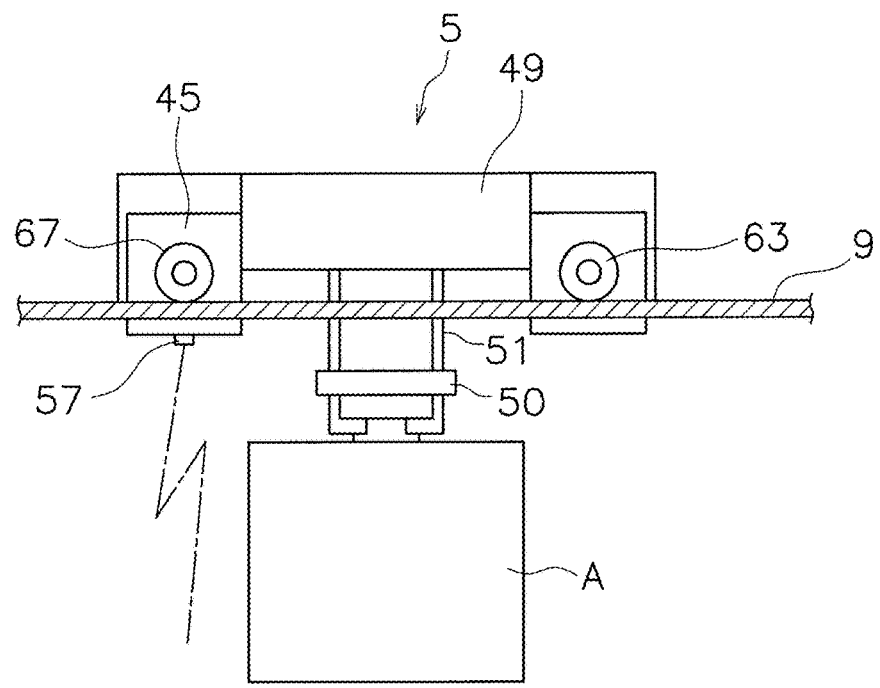
FIG. 3 is a side view of a local cart.

A transport system 1 of a first preferred embodiment of the present invention is described with reference to FIGS. 1 to 3. FIG. 1 is a side view of a main portion of the transport system 1 of the first preferred embodiment. FIG. 2 is a plan view of a main portion of the transport system 1. FIG. 3 is a side view of a local cart 5.

The transport system 1 includes a ceiling traveling vehicle 3. The ceiling traveling vehicle 3 performs interbay transportation and intrabay transportation in a semiconductor factory, for example.

The transport system 1 includes the local cart 5. The local cart 5 loads and unloads an article A such as an FOUP with respect to each processor 19, or loads and unloads articles A with respect to a plurality of neighboring processors 19.

The transport system 1 includes a first track 7. The first track 7 is a track of the ceiling traveling vehicle 3 and includes a metal rail and a conductor.

The transport system 1 includes a second track 9. The second track 9 is a track of the local cart 5 and includes a first metal rail 11A and a second metal rail 11B illustrated in FIG. 2. The article A can pass through a space between the first metal rail 11A and the second metal rail 11B in an up and down direction. The local cart 5 travels above the second track 9, but it may travel below the second track 9.

The processor 19 includes one or more load ports 13. The first track 7, the second track 9, and a buffer 15 extend in parallel or substantially in parallel to the front surface of the processor 19.

The ceiling 17 is a ceiling of a clean room or the like. The first track 7, the second track 9, and the buffer 15 are supported by columns 21, 23, and 25.

The buffer 15, on which the article A is temporarily placed, is disposed below the second track 9 and in parallel or substantially in parallel to the first track 7 and the second track 9. The height of the buffer 15 is set so that the local cart 5 carrying an article A can pass above the buffer 15 on which an article A is temporarily placed.

The first track 7 is at the highest position, and the second track 9 is directly below the first track 7, for example, so that the first track 7 and the second track 9 are disposed in parallel or substantially in parallel to each other in the up and down direction. The buffer 15 is disposed directly below the first track 7 and the second track 9 in parallel or substantially in parallel to the same, and the load port 13 is directly below the first track 7 and the second track 9.

The transport system 1 includes a local controller 27. The local controller 27 controls the local cart 5 and communicates with the local cart 5 via optical communication or the like. Note that the local controller 27 may be disposed on the ground side.

The ceiling traveling vehicle 3 includes a lifting platform 29 and a hoist (not shown) to move the lifting platform 29 up and down, so as to transfer the article A in the vertical direction. The ceiling traveling vehicle 3 includes an optical communication unit 31. With optical communication using a light beam having a vertical optical axis and passing through a travel route of the local cart 5, the optical communication unit 31 performs interlocking before transferring the article A with an optical communication unit 33 disposed on the load port 13 side. Furthermore, the ceiling traveling vehicle 3 includes a communicator (not shown) that communicates with the local controller 27 when the article A is transferred to or from the buffer 15.

The processor 19 is a machining device, an inspection device, or the like. The load port 13 is disposed on the front surface of the processor 19. The ceiling traveling vehicle 3, the local cart 5, or a person moving on the floor transfers the article A to or from the load port 13. The front surface of the processor 19 is provided with a display 37, an operation panel 39, and the like in addition to the load port 13. A display 37 and an operation panel 39 monitor an operation status of the processor 19, and the processor 19 can be manually controlled.

The distance between the first metal rail 11A and the second metal rail 11B of the second track 9 is larger than a depth of the article A. The article A can pass through the space between the first metal rail 11A and the second metal rail 11B in the vertical direction together with the lifting platform 29. Furthermore, the buffer 15 includes an opening 43 above the load port 13. The opening 43 enables the article A to pass though the buffer 15 in the vertical direction. Alternatively, the buffer 15 is disposed away from directly above the load port 13. In this way, even if the first track 7, the second track 9 and the load port 13 are disposed in an overlapping manner in the vertical direction, the ceiling traveling vehicle 3 can transfer the article A to or from the load port 13 or the buffer 15. Similarly, the local cart 5 can transfer the article A to or from the buffer 15 or the load port 13. Therefore, in a plan view, the floor area occupied by the transport system 1 can be reduced or minimized.

With reference to FIG. 3, a structure of the local cart 5 is described. The local cart 5 includes a travel motor 45 (one example of a travel drive motor). The local cart 5 includes a first electricity receiving tire 63, a second electricity receiving tire 65, and a drive tire 67, so as to travel on the second track 9 (as described later).

The local cart 5 includes a hoist 49. The hoist 49 winds up or sends out a suspension 51, so as to move up and down the article A supported by a lifting platform 50.

The local cart 5 includes an optical communication unit 57. Similarly to the optical communication unit 31 of the ceiling traveling vehicle 3, the optical communication unit 57 performs communication to interlock with the optical communication unit 33 of the load port 13.

The local cart 5 has a simple structure with a short travel distance without a mechanism to move the article laterally or the like and without an information processing mechanism for selecting a travel route or for avoiding interruption with other carts. For instance, one local cart 5 is allowed to travel along the second track 9, and the local controller 27 controls the same to reciprocate between the front surface of the processor 19 and a position a little apart from the front surface. Further, the local cart 5 travels along the second track 9 directly below the first track 7 of the ceiling traveling vehicle, and hence no additional floor area is required. In addition, the space between the first metal rail 11A and the second metal rail 11B of the second track 9 is larger than the depth of the article A, and hence the article A can be transferred so as to pass through the second track 9 in the vertical direction.

Control of the ceiling traveling vehicle 3 and the local cart 5 in this preferred embodiment is described.

The ceiling traveling vehicle 3 is controlled by a host controller (not shown). The local controller 27 communicates with the host controller, the ceiling traveling vehicle 3, and the local cart 5. When the ceiling traveling vehicle 3 or the local cart 5 transfers the article A to or from the load port 13, interlocking is performed using the optical communication units 31, 33, and 57.

If the local cart 5 is located directly above the load port 13, the ceiling traveling vehicle 3 cannot perform optical communication, and hence interlocking is not established. Therefore, transfer of the article A is delayed until the local cart 5 moves to another position. As to the transfer of the article A between the buffer 15 and the ceiling traveling vehicle 3, interlocking is established by communication between the ceiling traveling vehicle 3 and the local controller 27. Further, the local cart 5 transfers the article A to or from the buffer 15 in accordance with an instruction from the local controller 27. In this case, interlocking before transferring is not performed.

The communication described above makes it possible to obtain inventory data showing which article is at which position on the buffer 15, and the local controller 27 stores the inventory data. The local controller 27 administers the article A on the buffer 15. Further, interlocking to the load port 13 is established by direct communication with the ceiling traveling vehicle 3 and the local cart 5 or by communication via the local controller 27.

Figure 4:
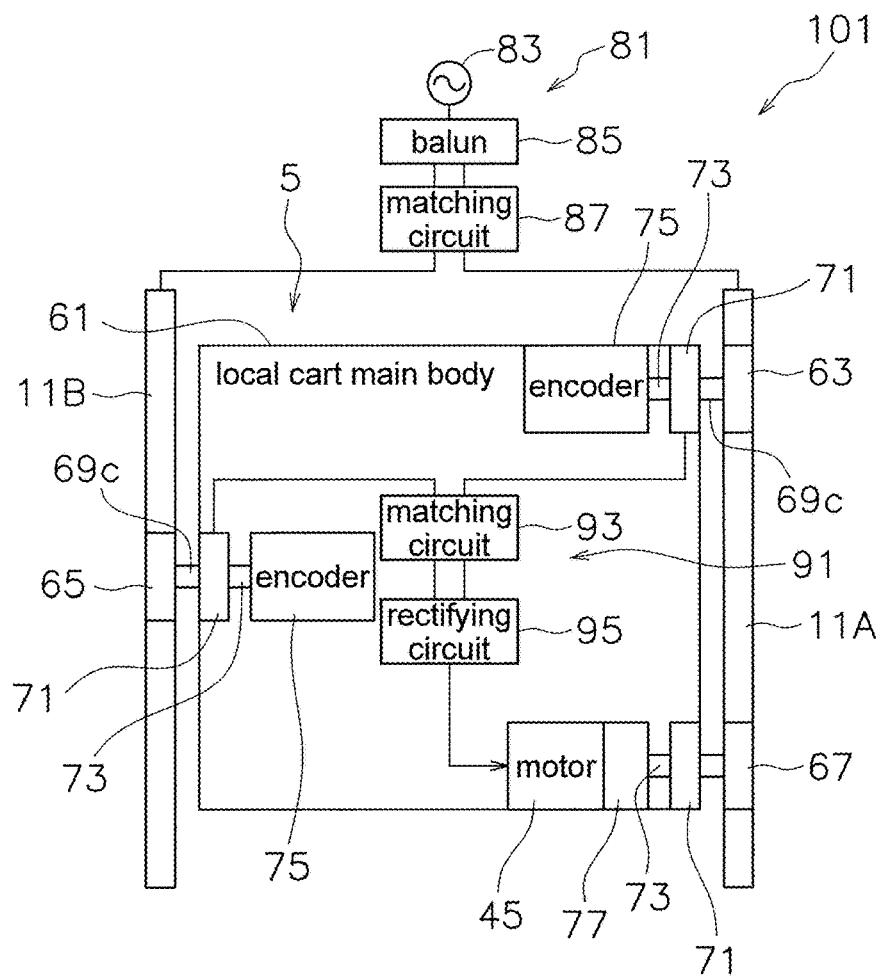
FIG. 4 is a schematic plan view of the local cart.
Figure 5:
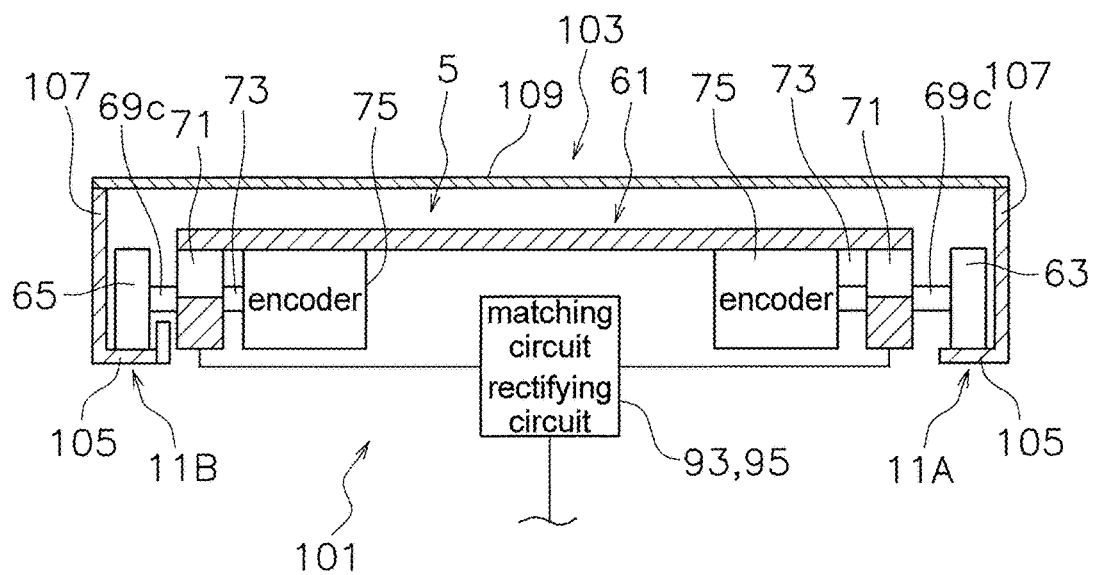
FIG. 5 is a schematic front view of the local cart.
Figure 6:
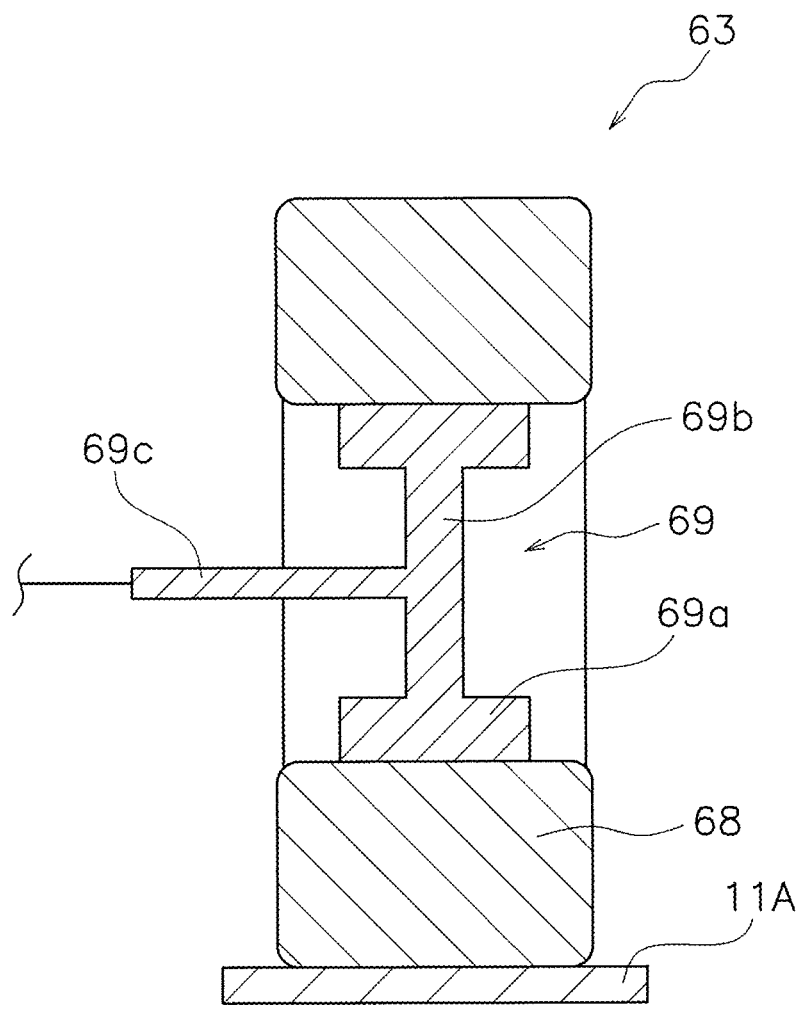
FIG. 6 is a schematic cross-sectional view of an electricity receiving tire.

With reference to FIGS. 4 to 6, there is described a local cart traveling system 101 (one example of a traveling body system) using the local cart 5, the first metal rail 11A, and the second metal rail 11B.

FIG. 4 is a schematic plan view of the local cart 5. FIG. 5 is a schematic front view of the local cart 5. FIG. 6 is a schematic cross-sectional view of the electricity receiving tire 63.

The local cart 5 includes a local cart main body 61, the first electricity receiving tire 63, the second electricity receiving tire 65, and the drive tire 67.

The first electricity receiving tire 63 (one example of a first wheel) and the second electricity receiving tire 65 (one example of a second wheel) contact and travel on the first metal rail 11A and the second metal rail 11B (one example of the track), respectively, and are tires that receive electricity.

As illustrated in FIG. 6, the first electricity receiving tire 63 includes an elastic layer 68 corresponding to a contact portion to a floor surface, and a wheel 69 (one example of a metal shaft) as an in-tire conductor disposed inside the elastic layer 68. In other words, the first electricity receiving tire 63 is a solid tire including the wheel 69 and the solid elastic layer 68 covering the outer circumference surface of the wheel 69.

The elastic layer 68 is specifically a polyurethane rubber tire.

As illustrated in FIG. 6, the wheel 69 includes a cylindrical portion 69a on the outer circumference side, a disc portion 69b on the inner side, and a shaft 69c extending from the disc portion 69b.

Note that a structure of the second electricity receiving tire 65 is the same as that of the first electricity receiving tire 63.

When the first metal rail 11A and the second metal rail 11B are supplied with AC power, capacitive couplings occur between the first metal rail 11A and the first electricity receiving tire 63, and between the second metal rail 11B and the second electricity receiving tire 65, respectively, and thus the local cart 5 is supplied with power. Specifically, when the first electricity receiving tire 63 and the second electricity receiving tire 65 are in contact with the first metal rail 11A and the second metal rail 11B, a first capacitor is defined between the first metal rail 11A and the wheel 69 of the first electricity receiving tire 63, and a second capacitor is defined between the second metal rail 11B and the wheel 69 of the second electricity receiving tire 65.

The elastic layer 68 is made of polyurethane rubber. In other words, the elastic layer 68 is in a range, for example, $\varepsilon$=about 6.5 to about 7.1, and tan $\delta$=about 0.015 to about 0.017. In this case, the capacitive coupling is increased, and the power transfer is efficient.

The elastic layer 68 may be made of a material other than the polyurethane rubber. For instance, it may be made of vinyl chloride resin, nylon resin, other resin, or natural rubber. In this case, two preferred conditions are described below.

First, it is preferred that the elastic layer 68 be made of a material having a dielectric constant ($\varepsilon$) larger than that of air. In other words, it is preferred that the dielectric constant of the elastic layer 68 be larger than one. In this case, the capacitive coupling is increased, and the power transfer is efficient.

Secondly, it is preferred that the elastic layer 68 be made of a material having a small dielectric dissipation factor (tan $\delta$). In this case, the electrical energy loss in the capacitor is small.

As illustrated in FIGS. 4 and 5, each of the shafts 69c of the wheels 69 of the first electricity receiving tire 63 and the second electricity receiving tire 65 is supported by a metal bearing 71 covered with an insulated cover in a rotatable manner with respect to the local cart main body 61. Further, an encoder 75 is connected to an insulated shaft 73 connected to the shaft 69c.

The drive tire 67 (one example of a third wheel) contacts and travels on the first metal rail 11A, and is a tire to generate a travel driving force. As illustrated in FIG. 4, the drive tire is supported by the bearing 71 in a rotatable manner with respect to the local cart main body 61. Furthermore, a brake 77 and the travel motor 45 are connected to the shaft 73. The first electricity receiving tire 63 and the second electricity receiving tire 65 are a carbonless tire in which the polyurethane rubber does not contain carbon particles, and the drive tire 67 is a tire in which the polyurethane rubber contains the carbon particles. In this case, as the first electricity receiving tire 63 and the second electricity receiving tire 65 do not contain carbon, the dielectric dissipation factor (tan $\delta$) is small, and as a result, the electrical energy loss in the capacitor is small. On the other hand, the drive tire 67 has an anti-static function in which static electricity is discharged from the local cart main body 61 to the first metal rail 11A.

As illustrated in FIG. 5, the first metal rail 11A and the second metal rail 11B have an L-shaped cross section and are laid out in parallel or substantially in parallel to face each other. The first metal rail 11A and the second metal rail 11B have a travel support portion 105 including a horizontal travel support surface, and a vertical wall 107 extending upward therefrom. At least portions of the side surfaces of the vertical walls 107, specifically the upper ends thereof are connected to each other via a connecting plate 109. The first metal rail 11A, the second metal rail 11B, and the connecting plate 109 described above define a frame track 103. Note that the entire of the frame track 103 is not shown in FIGS. 1 to 3 for simplification.

The connecting plate 109 is made of an insulator. In other words, the first metal rail 11A and the second metal rail 11B are insulated from each other. The connecting plate 109 covers the upper surfaces, preferably the entire upper surfaces of the vertical walls 107 of the first metal rail 11A and the second metal rail 11B. In this way, the connecting plate 109 is disposed over the first metal rail 11A and the second metal rail 11B, so as to cover the upper portions of the first metal rail 11A and the second metal rail 11B, and hence a worker hardly touches the first metal rail 11A or the second metal rail 11B. Therefore, there is little risk that the worker would receive an electric shock.

Note that it is not required to dispose the connecting plate 109 to cover the entire area in the travel direction. The connecting plate 109 may be partially disposed in one are or a plurality of areas.

Note that the connecting plate 109 may cover a portion or the whole of the sides of the vertical walls 107 in addition to the upper portions of the vertical walls 107.

The local cart traveling system 101 includes a voltage supplier 81 to supply power to the vehicle. The voltage supplier 81 is connected to the first metal rail 11A and the second metal rail 11B, so as to supply an AC voltage to the first metal rail 11A and the second metal rail 11B. The AC voltage includes a rectangular waveform.

The voltage supplier 81 includes a signal generator 83, a balun 85, and a matching circuit 87. The balun 85 can transmit high frequency signals up to 5 GHz, for example. The matching circuit 87 makes an impedance matching. The AC power after the matching is supplied to the first metal rail 11A and the second metal rail 11B. Note that the structure of the voltage supplier is not particularly limited.

The local cart 5 includes a power receiver 91. The power receiver 91 receives AC power from the first capacitor and the second capacitor via the wheels 69, rectifies the taken-out AC power, and supplies the power to the travel motor 45 directly or indirectly via a battery. The power receiver 91 includes a matching circuit 93 and a rectifying circuit 95. The matching circuit 93 performs impedance matching. The rectifying circuit 95 rectifies the received AC power into DC power. The wheels 69 of the first electricity receiving tire 63 and the second electricity receiving tire 65 are connected to the matching circuit 93, and the rectifying circuit 95 is connected to the travel motor 45. Note that the structure of the power receiver is not particularly limited.

The preferred embodiment described above can produce the following advantageous functions and effects.

First, by the power transfer using the first electricity receiving tire 63 and the second electricity receiving tire 65, efficient power transfer can be realized.

Secondly, in the local cart traveling system 101, the first electricity receiving tire 63 and the second electricity receiving tire 65 used for the power supply are the solid tire including the wheel 69 and the solid elastic layer 68 covering the outer circumference surface of the wheel 69, and hence there is no air layer. Thus, the capacitive coupling is increased, and the power transfer is efficient.

Furthermore, in the local cart 5, a power supply structure using a flexible power supply wire and a flexible protection cover can be eliminated. In this way, it is possible to reduce risk of breakage of the power supply wire due to repeated reciprocating travel of an intermediate transferring cart, and a space for the protection cover (cable bear (registered trademark)) is not required.

In addition, in the local cart 5, a battery can be eliminated, and hence weight of the local cart can be reduced. As a result, it is not required to use a motor having a large rated current for travel driving force.

2. Second Preferred Embodiment

Figure 7:
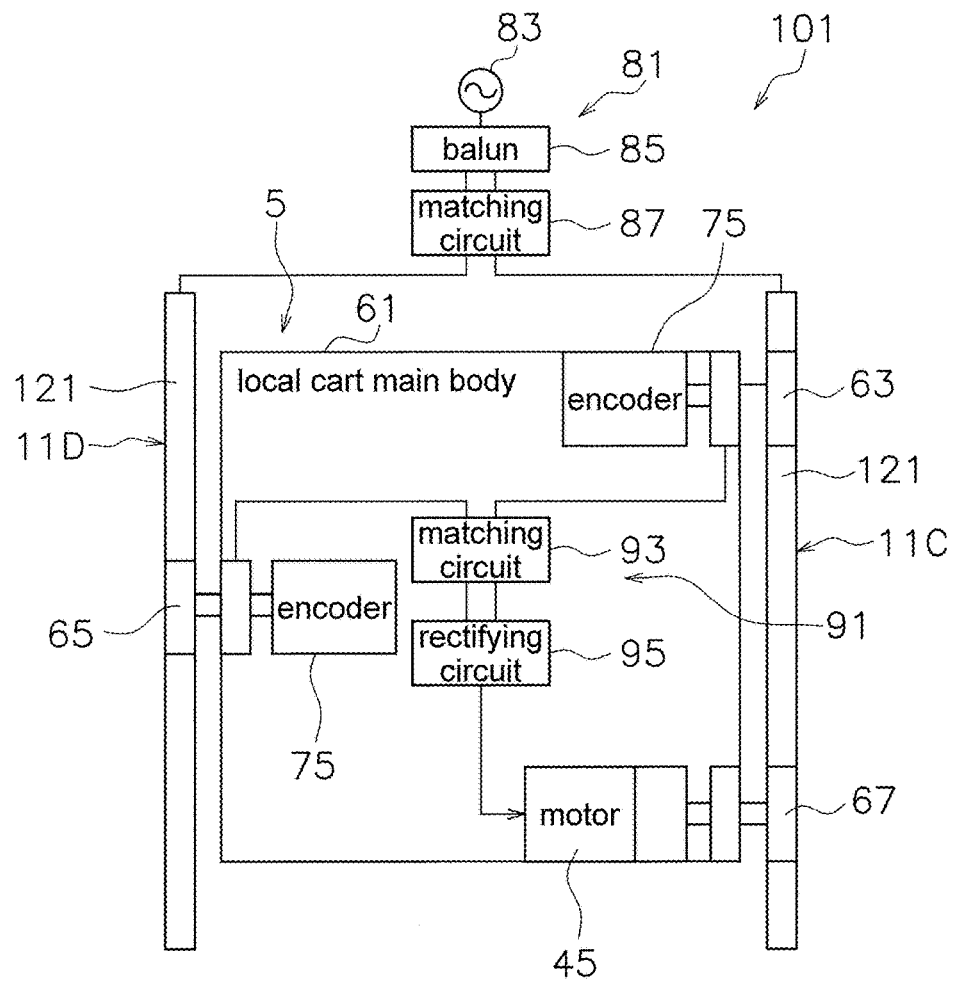
FIG. 7 is a schematic plan view of the local cart of a second preferred embodiment of the present invention.
Figure 8:
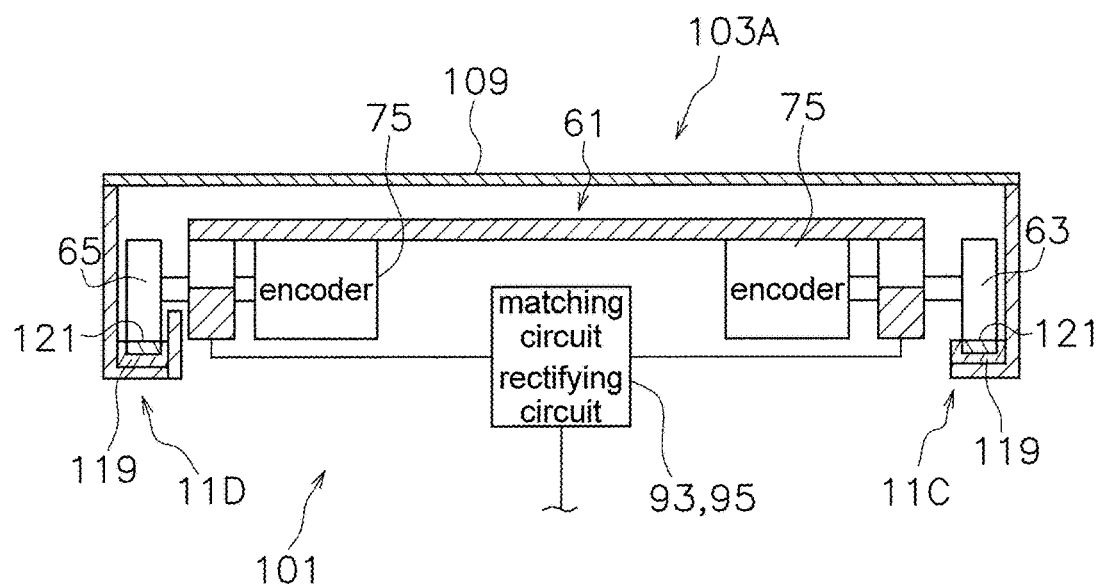
FIG. 8 is a schematic front view of the local cart of the second preferred embodiment of the present invention.
Figure 9:
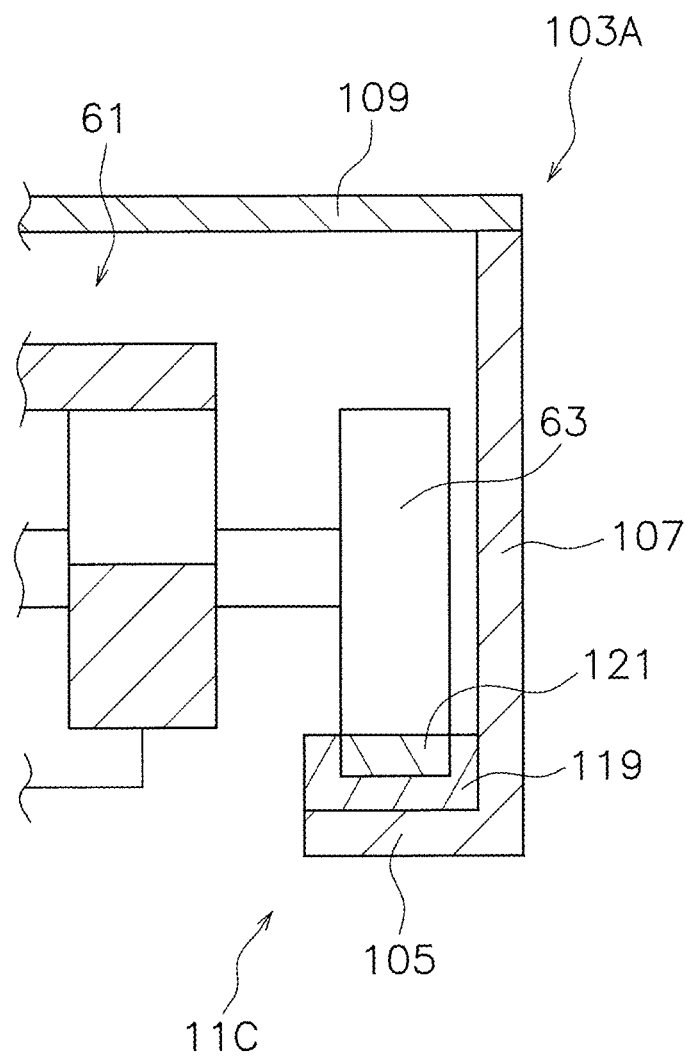
FIG. 9 is a partial enlarged view of FIG. 8.

With reference to FIGS. 7 to 9, a second preferred embodiment of the present invention is described. FIG. 7 is a schematic plan view of the local cart 5 of the second preferred embodiment. FIG. 8 is a schematic front view of the local cart 5 of the second preferred embodiment. FIG. 9 is a partial enlarged view of FIG. 8.

Note that a basic structure and operation are the same as those in the first preferred embodiment, and hence different points are mainly described.

A frame track 103A includes electrical insulators 119 disposed on the travel support portions 105 of a first metal rail 11C and a second metal rail 11D, and conductors 121 provided to the electrical insulators 119 and supplied with the AC voltage. Specifically, the conductor 121 is provided on the upper surface of the electrical insulator 119. Note that the conductor 121 may be covered with the electrical insulator 119.

In this local cart traveling system 101, the first metal rail 11C and the second metal rail 11D of the frame track 103A are electrically insulated from the conductors 121 by the electrical insulators 119. Therefore, the first metal rail 11C, the second metal rail 11D, and the connecting plate 109 of the frame track 103A are not charged. Therefore, even if a worker accidentally touches the first metal rail 11C, the second metal rail 11D, or the connecting plate 109, there is little risk that the worker would receive an electric shock.

In this preferred embodiment, even if the connecting plate 109 is made of a conductor, there is little risk of receiving an electric shock because the connecting plate 109 is not charged. In addition, the connecting plate may be eliminated.

In this preferred embodiment, the conductors 121 are disposed inside the first metal rail 11C and the second metal rail 11D, and hence electromagnetic radiation from the conductor 121 is able to be reduced.

3. Third Preferred Embodiment

Although the two conductors are apart from each other in the first preferred embodiment and in the second preferred embodiment, they may be disposed close to each other.

Figure 10:
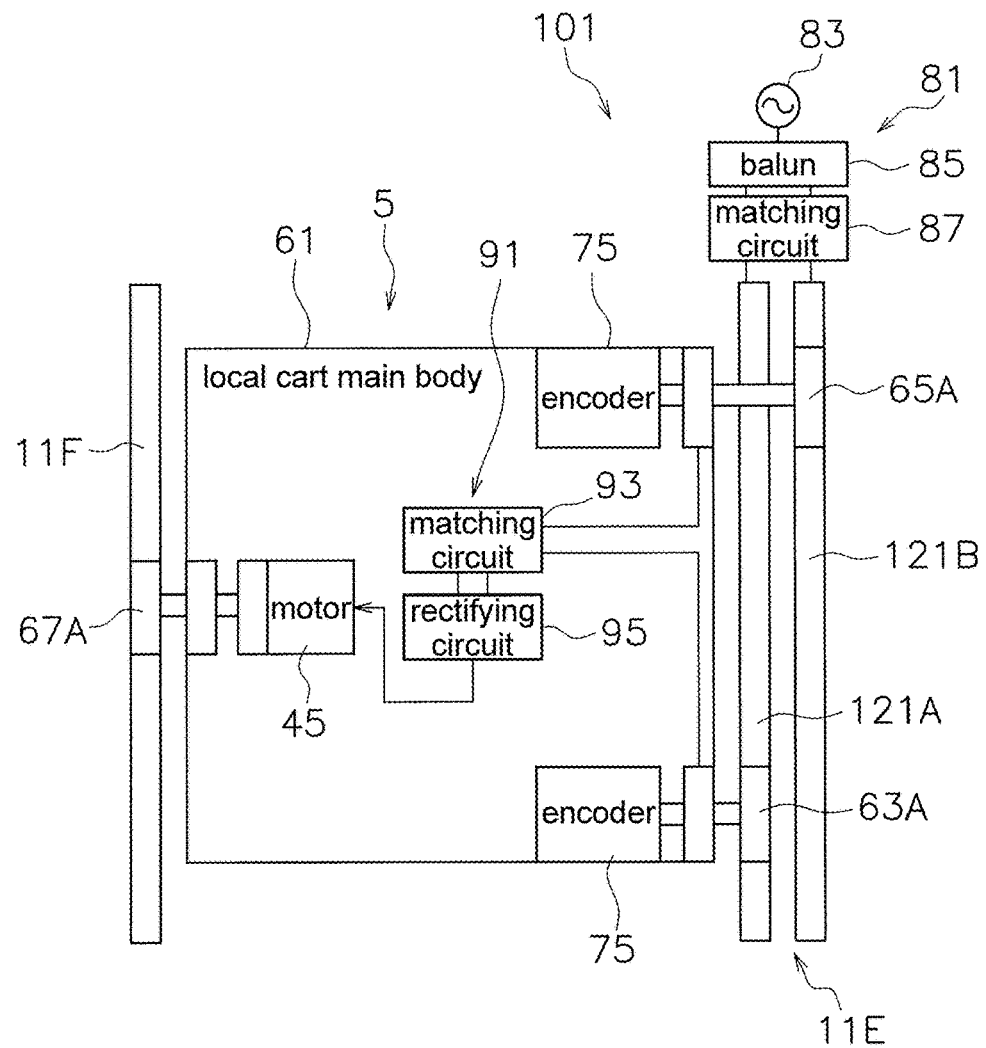
FIG. 10 is a schematic plan view of the local cart of a third preferred embodiment of the present invention.
Figure 11:
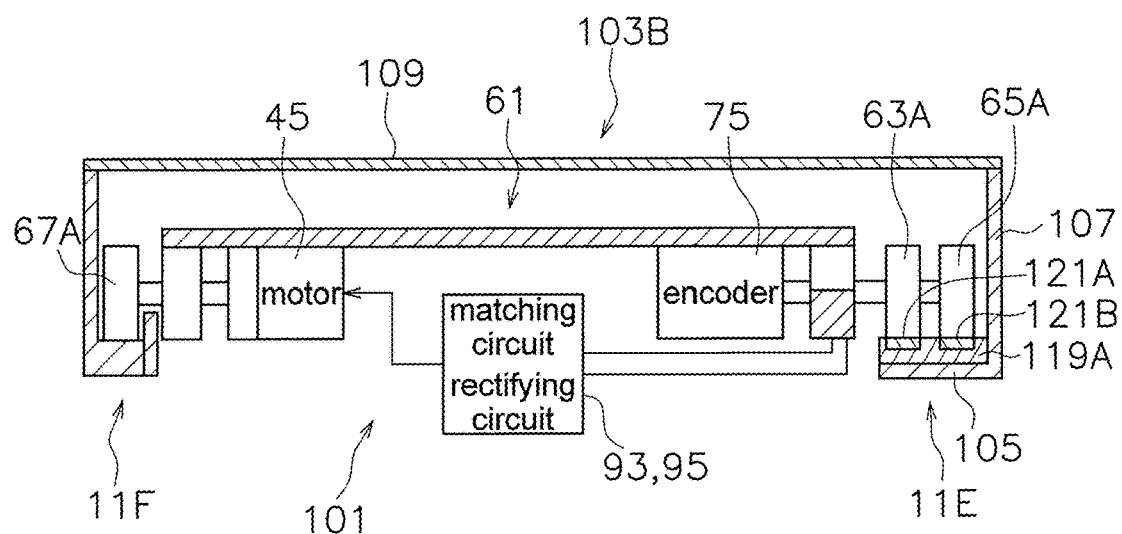
FIG. 11 is a schematic front view of the local cart of the third preferred embodiment of the present invention.
Figure 12:
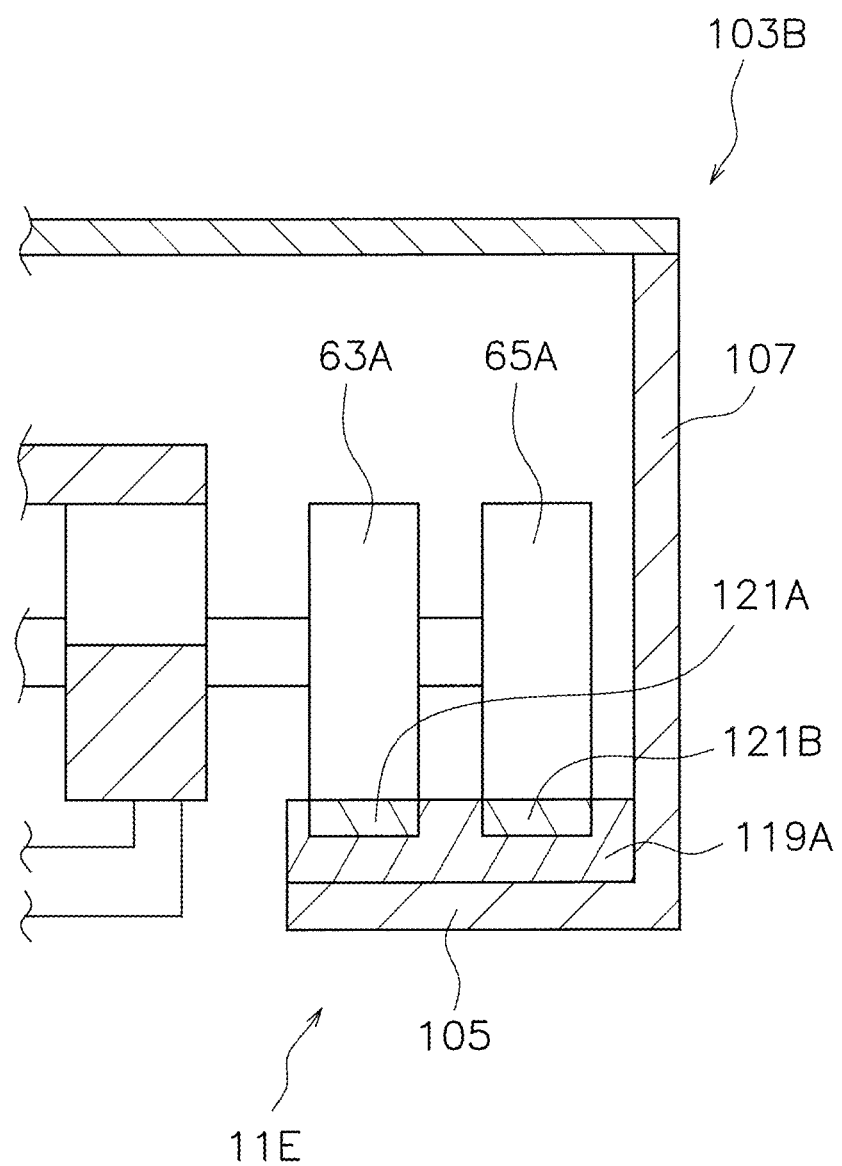
FIG. 12 is a partial enlarged view of FIG. 11.

With reference to FIGS. 10 to 12, such a preferred embodiment of the present invention is described. FIG. 10 is a schematic plan view of the local cart 5 of a third preferred embodiment of the present invention. FIG. 11 is a schematic front view of the local cart of the third preferred embodiment. FIG. 12 is a partial enlarged view of FIG. 11.

Note that a basic structure and operation are the same as those in the second preferred embodiment, and hence different points are mainly described below.

A frame track 103B includes a metal rail 11E and a travel rail 11F. The metal rail 11E has an L-shaped cross section. The metal rail 11E includes the travel support portion 105 including a horizontal travel surface, and the vertical wall 107 extending upward therefrom. The travel rail 11F has an L-shaped cross section and includes a travel portion and a vertical wall.

The frame track 103B includes an electrical insulator 119A disposed on the travel support portion 105 of the metal rail 11E, and a first conductor 121A and a second conductor 121B, which are provided to the electrical insulator 119A. The first conductor 121A and the second conductor 121B are supplied with the AC voltage. Specifically, the first conductor 121A and the second conductor 121B are provided on the upper surface of the electrical insulator 119A. Note that the first conductor 121A and the second conductor 121B may be covered with the electrical insulator 119A.

The first conductor 121A and the second conductor 121B are laid out in parallel or substantially in parallel with a small gap in a width direction. Therefore, electromagnetic radiation between them is small.

A first electricity receiving tire 63A and a second electricity receiving tire 65A travel on the first conductor 121A and the second conductor 121B, respectively.

A drive tire 67A travels on the travel rail 11F.

High frequency AC power is differentially transmitted to the first conductor 121A and the second conductor 121B.

Therefore, high frequency noise hardly occurs, and hence there is less risk of adversely affecting electric equipment existing around the local cart traveling system 101.

In this local cart traveling system 101, the metal rail 11E of the frame track 103B is electrically insulated from the first conductor 121A and the second conductor 121B by the electrical insulator 119A. Therefore, the metal rail 11E and the connecting plate 109 of the frame track 103B are not charged.

In this preferred embodiment, even if the connecting plate 109 is made of a conductor, the connecting plate 109 is not charged, and hence there is little risk of receiving an electric shock. In addition, the connecting plate may be eliminated.

In this preferred embodiment, the first conductor 121A and the second conductor 121B are disposed inside the metal rail 11E, and high frequency AC power is differentially transmitted to the first conductor 121A and the second conductor 121B. Therefore, electromagnetic radiation from the first conductor 121A and the second conductor 121B is reduced.

4. Fourth Preferred Embodiment

Although the first electricity receiving tire and the second electricity receiving tire are contact with the conductor in the second preferred embodiment and in the third preferred embodiment, an insulator may be disposed between them.

Figure 13:
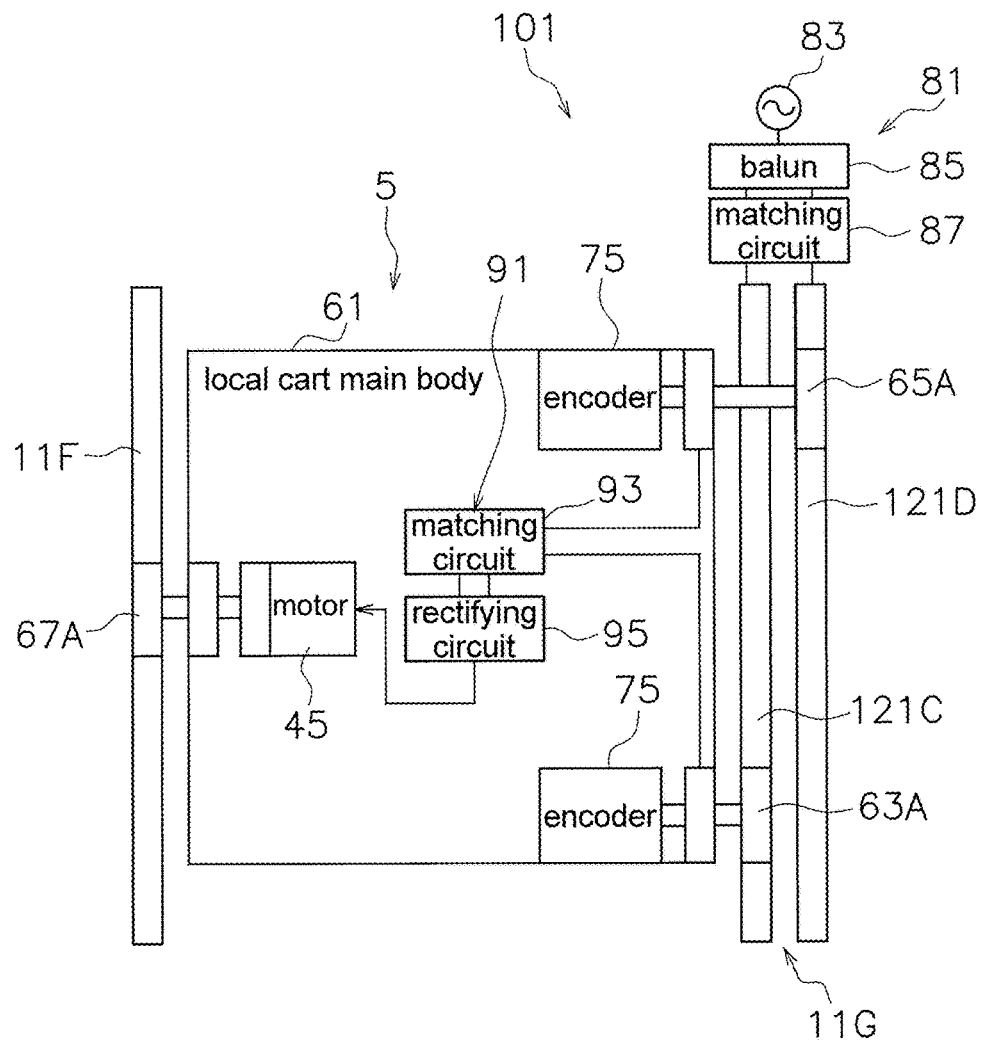
FIG. 13 is a schematic plan view of the local cart of a fourth preferred embodiment of the present invention.
Figure 14:
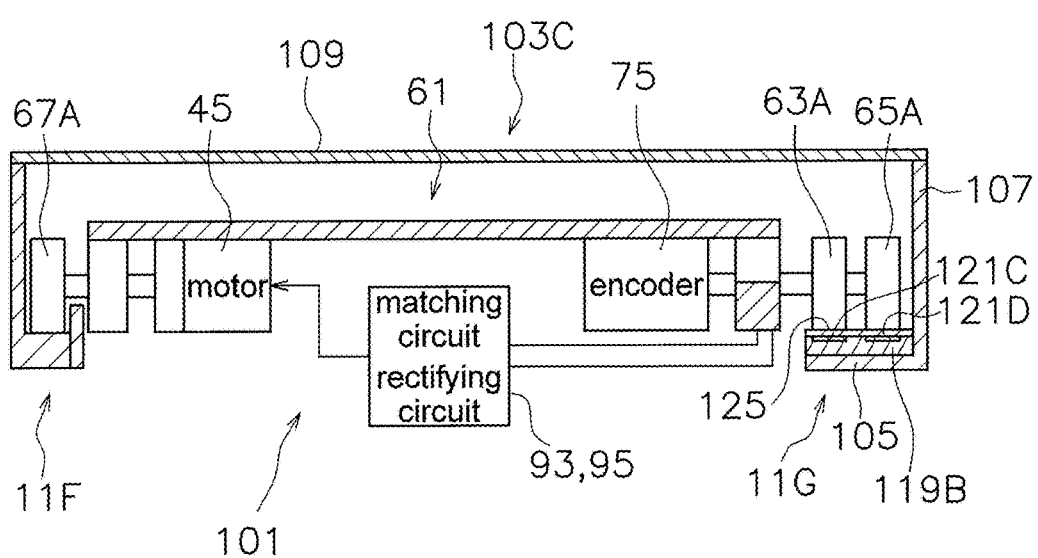
FIG. 14 is a schematic front view of the local cart of the fourth preferred embodiment of the present invention.
Figure 15:
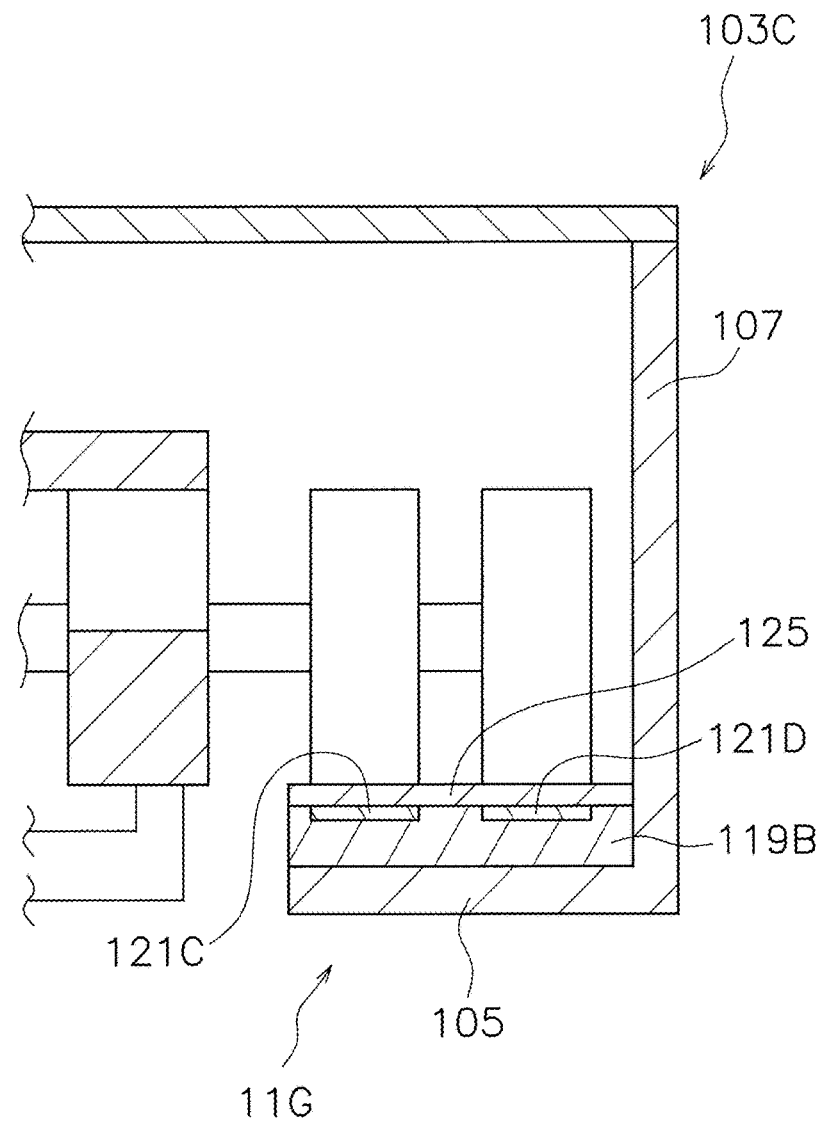
FIG. 15 is a partial enlarged view of FIG. 14.

With reference to FIGS. 13 to 15, such a preferred embodiment of the present invention is described. FIG. 13 is a schematic plan view of the local cart 5 of a fourth preferred embodiment of the present invention. FIG. 14 is a schematic front view of the local cart 5 of the fourth preferred embodiment. FIG. 15 is a partial enlarged view of FIG. 14.

Note that a basic structure and operation are the same as those in the third preferred embodiment, and hence different points are mainly described below.

A frame track 103C includes a metal rail 11G and the travel rail 11F. The metal rail 11G includes an L-shaped cross section. The metal rail 11G includes the travel support portion 105 including a horizontal travel surface, and the vertical wall 107 extending upward therefrom. The travel rail 11F has an L-shaped cross section and includes the travel portion and the vertical wall.

The frame track 103C includes an electrical insulator 119B disposed on the travel support portion 105 of the metal rail 11G, and a first conductor 121C and a second conductor 121D, which are provided to the electrical insulator 119B. The first conductor 121C and the second conductor 121D are supplied with the AC voltage. The first conductor 121C and the second conductor 121D are laid out in parallel or substantially in parallel with a small gap in a width direction.

The frame track 103C further includes a second electrical insulator 125 disposed on the first conductor 121C and the second conductor 121D.

The first electricity receiving tire 63A and the second electricity receiving tire 65A correspond to the first conductor 121C and the second conductor 121D, and travel on the second electrical insulator 125.

In this local cart traveling system 101, the metal rail 11G of the frame track 103C is electrically insulated from the first conductor 121C and the second conductor 121D by the electrical insulator 119B. Therefore, the metal rail 11G and the connecting plate 109 of the frame track 103C are not charged.

In this preferred embodiment, the first conductor 121C and the second conductor 121D are covered with the second electrical insulator 125, and hence there is less risk that a worker would receive an electric shock. With the safety measure of this preferred embodiment, it has been experimentally confirmed that current flowing in a human body equivalent circuit is less than about 20 mA as a general environmental guideline value, and hence there is no problem even if a worker touches the connecting plate 109.

The second electrical insulator 125 is made of, for example, an FR4 substrate (glass epoxy substrate), and the first conductor 121A and the second conductor 121B are patterned wires on the substrate. The second electrical insulator 125 is fixed to the electrical insulator 119B. In this case, the second electrical insulator 125 as a resin substrate, the first conductor 121A and the second conductor 121B as the metal thin film can be formed integrally, so that manufacturing, carrying, and attaching thereof become easy. In other words, mass productivity is improved. In addition, the FR4 substrate is superior to an MC nylon substrate in the power transfer characteristics.

In addition, in the transport system 1 of this preferred embodiment, a safety distance can be smaller than that before taking the measure. The safety distance is a distance to be kept between workers and the system to secure the safety of the workers. For instance, it is defined as a distance satisfying the condition equal to or less than general environmental guideline value defined by the ICNIRP guideline 1998 (electric field strength is 28 V/m and magnetic field intensity is 0.073 A/m at an electromagnetic field frequency of 13.56 MHz). In the transport system before taking the measure, in which the conductor is not insulated at all, the safety distance is 1300 mm or more. In contrast, in the transport system 1 of this preferred embodiment, it has been experimentally confirmed that the safety distance is about 540 mm in the vertical direction and about 460 mm in the horizontal direction, for example. Therefore, in this preferred embodiment, the space that workers can safely use in the factory is able to be larger than that before taking the measure.

5. Fifth Preferred Embodiment

In the first to fourth preferred embodiments, the local cart includes three tires, i.e. the first electricity receiving tire, the second electricity receiving tire, and the traveling drive tire, but the number of tires is not particularly limited. For instance, it may have total four tires.

Figure 16:
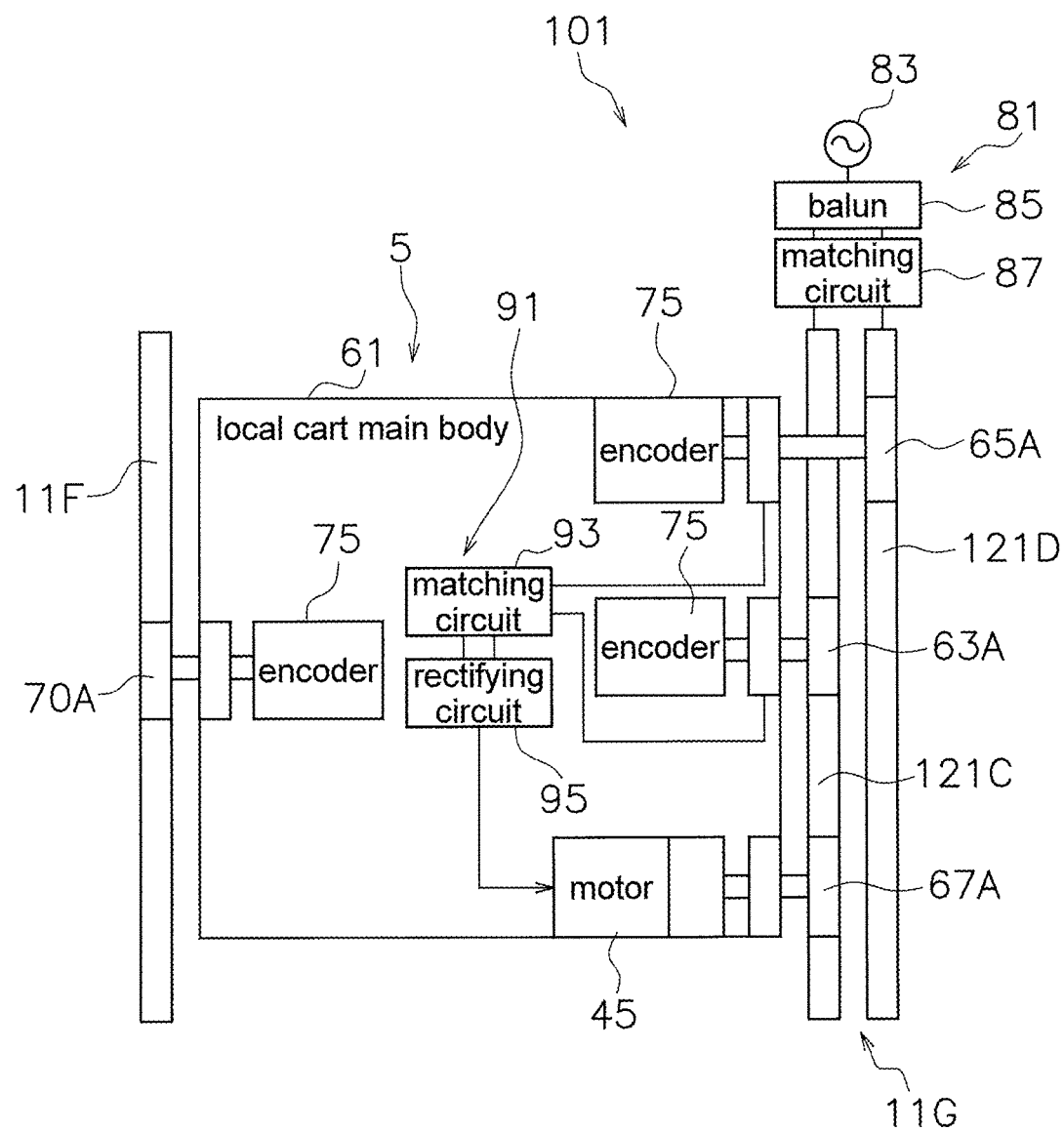
FIG. 16 is a schematic plan view of the local cart of a fifth preferred embodiment of the present invention.

With reference to FIG. 16, such a preferred embodiment is described. FIG. 16 is a schematic plan view of the local cart 5 of a fifth preferred embodiment.

Note that a basic structure and operation are the same as those in the third preferred embodiment or the fourth preferred embodiment, and hence different points are mainly described below.

The frame track includes the metal rail 11G and the travel rail 11F.

The frame track includes an electrical insulator (not shown) disposed on a travel portion (not shown) of the metal rail 11G, and the first conductor 121C and the second conductor 121D, which are provided to the electrical insulator 119B. The first conductor 121C and the second conductor 121D are supplied with the AC voltage. The first conductor 121C and the second conductor 121D are laid out in parallel or substantially in parallel with a small gap in a width direction.

The first electricity receiving tire 63A and the second electricity receiving tire 65B travel on the first conductor 121C and the second conductor 121D, respectively.

The drive tire 67A travels on the first conductor 121C of the metal rail 11G unlike the fourth preferred embodiment.

The local cart 5 further includes a driven tire 70A. The driven tire 70A travels on the travel rail 11F. The encoder 75 is connected to the driven tire 70A.

As described above, the local cart 5 has total four tires including the first electricity receiving tire 63A and the second electricity receiving tire 65A. In this preferred embodiment, the local cart 5 travels with stability.

Note that the drive tire 67A may travel on the second conductor 121D.

In addition, the drive tire 67A and the driven tire 70A may be exchanged.

6. Common Matters in Preferred Embodiments

The following matters are common in the second to fifth preferred embodiments of the present invention.

The traveling body system (e.g. the local cart traveling system 101) includes the frame track (e.g., the frame track 103, the frame track 103A, the frame track 103B, or the frame track 103C), the traveling body (e.g. the local cart 5), and the voltage supplier (e.g. the voltage supplier 81).

The frame track includes the first metal rail (e.g. the first metal rail 11A or the first metal rail 11C) and the second metal rail (e.g. the second metal rail 11B or the second metal rail 11D), which have an L-shaped cross section and are laid out in parallel or substantially in parallel to face each other.

The traveling body is disposed within the frame track, includes the first wheel (e.g. the first electricity receiving tire 63) and the second wheel (e.g. the second electricity receiving tire 65), and travels on the horizontal travel surfaces of the first metal rail and the second metal rail.

The voltage supplier supplies the AC voltage to at least the travel surfaces of the first metal rail and the second metal rail, and the first metal rail and the first wheel define the first capacitor and the second metal rail and the second wheel define the second capacitor.

The traveling body includes the power receiver (e.g., the power receiver 91 to receive AC power from the first capacitor and the second capacitor), and the travel drive motor (e.g., the travel motor 45) to directly or indirectly receive power after the AC power received by the power receiver 91 is rectified.

The frame track includes the electrical insulator (e.g. the electrical insulator 119, the electrical insulator 119A, or the electrical insulator 119B) disposed on the travel surfaces of the first metal rail and the second metal rail, and the conductors (e.g. the conductors 121, the first conductor 121A and the second conductor 121B, or the first conductor 121C and the second conductor 121D) disposed on the electrical insulator and supplied with the AC voltage.

In this traveling body system, the first metal rail and the second metal rail of the frame track are electrically insulated from the conductor by the electrical insulator. Therefore, the frame track is not charged. Therefore, even if a worker accidentally touches the frame track, there is little risk that the worker would receive an electric shock.

7. Other Preferred Embodiments

Although a plurality of preferred embodiments of the present invention are described above, the present invention is not limited to the preferred embodiments described above, and various modifications can be made within the scope of the invention without deviating from the spirit thereof. In particular, the plurality of preferred embodiments and variations described in this specification can be arbitrarily combined as necessary.

A plurality of pairs of electricity receiving tires may be disposed instead of the one pair.

The electricity receiving tire may have a hollow body.

It is preferred that the traveling body systems of the preferred embodiments be applied to the field of a material handling system (MHS) such as semiconductor transportation or general logistics, as an example. It is because there is no problem using the solid tire for the wheel as the travel cart travels on a flat track. However, the traveling body systems of the preferred embodiments can be applied to many fields other than the above-mentioned field.

The traveling systems of the preferred embodiments are particularly suitable for devices that reciprocate in a predetermined linear range, and can be applied to reciprocating carts or loaders for a lathe, for example.

Preferred embodiments of the present invention can be widely applied to traveling body systems, in which AC power is taken out from a capacitor between a metal rail or a conductor and a wheel so as to drive a travel motor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A traveling body system comprising:
a frame track including at least one metal rail, an electrical insulator disposed on a travel surface of the at least one metal rail, and two conductors, the two conductors being provided to the electrical insulator and supplied with an AC voltage;

a traveling body disposed within the frame track and provided with a first wheel and a second wheel, so as to travel on the two conductors; and a voltage supplier to supply an AC voltage to each of the two conductors, so that a first of the two conductors and the first wheel define a first capacitor and a second of the two conductors and the second wheel define a second capacitor; wherein the traveling body includes a power receiver to receive AC power from the first capacitor and the second capacitor, and a travel drive motor to directly or indirectly receive power after the AC power received by the power receiver is rectified; and the two conductors are parallel or substantially parallel to a gap in a width direction, and the AC power is differentially transmitted to the two conductors.

2. The traveling body system according to claim 1, wherein the frame track further includes another electrical insulator disposed on the two conductors; and the first wheel and the second wheel travel on the another electrical insulator.

3. The traveling body system according to claim 2, wherein the another electrical insulator is a resin substrate, and the conductor is a metal thin film on the resin substrate.

4. The traveling body system according to claim 1, wherein the traveling body includes total four wheels including the first wheel and the second wheel.

5. A traveling body system comprising:

a frame track including a first metal rail and a second metal rail, the first metal rail and the second metal rail having an L-shaped cross section and being in parallel or substantially in parallel to face each other;

a traveling body disposed within the frame track and provided with a first wheel and a second wheel, so as to travel on horizontal travel surfaces of the first metal rail and the second metal rail; and a voltage supplier to supply an AC voltage to at least the travel surfaces of the first metal rail and the second metal rail, so that the first metal rail and the first wheel define a first capacitor and the second metal rail and the second wheel define a second capacitor; wherein the traveling body includes a power receiver to receive AC power from the first capacitor and the second capacitor, and a travel drive motor to directly or indirectly receive power after the AC power received by the power receiver is rectified; and the frame track includes an electrical insulator covering at least a portion of vertical wall surfaces of the first metal rail and the second metal rail.

* * * * *